(12) United States Patent
Hori et al.

(10) Patent No.: US 10,724,151 B2
(45) Date of Patent: Jul. 28, 2020

(54) DEVICE OF MANUFACTURING SILICON CARBIDE SINGLE CRYSTAL

(71) Applicant: SUMITOMO ELECTRIC INDUSTRIES, LTD., Osaka-shi, Osaka (JP)

(72) Inventors: Tsutomu Hori, Itami (JP); Shin Harada, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 165 days.

(21) Appl. No.: 14/834,539

(22) Filed: Aug. 25, 2015

(65) Prior Publication Data

US 2016/0122903 A1 May 5, 2016

(30) Foreign Application Priority Data

Oct. 31, 2014 (JP) .................................. 2014-223154
Nov. 5, 2014 (JP) .................................. 2014-225151

(51) Int. Cl.
*C30B 23/06* (2006.01)
*C30B 29/36* (2006.01)

(52) U.S. Cl.
CPC .......... *C30B 23/066* (2013.01); *C30B 23/063* (2013.01); *C30B 29/36* (2013.01)

(58) Field of Classification Search
CPC ...... C30B 23/063; C30B 23/066; C30B 29/36
See application file for complete search history.

(56) References Cited

U.S. PATENT DOCUMENTS

| 2007/0256630 | A1* | 11/2007 | Wang | C30B 23/00 |
| | | | | 117/208 |
| 2010/0139552 | A1* | 6/2010 | Rengarajan | C30B 23/06 |
| | | | | 117/84 |
| 2011/0111171 | A1* | 5/2011 | Oyanagi | C30B 23/00 |
| | | | | 428/131 |
| 2012/0000414 | A1* | 1/2012 | Bondokov | C30B 23/002 |
| | | | | 117/84 |
| 2013/0255568 | A1* | 10/2013 | Inoue | C30B 23/066 |
| | | | | 117/106 |

FOREIGN PATENT DOCUMENTS

| JP | 10-101495 A | 4/1998 |
| JP | 10291899 A * | 11/1998 |
| JP | 10291899 A * | 11/1998 |

(Continued)

*Primary Examiner* — Hua Qi
(74) *Attorney, Agent, or Firm* — Faegre Drinker Biddle & Reath LLP

(57) ABSTRACT

A device of manufacturing a silicon carbide single crystal includes a crucible, a first resistive heater, a second resistive heater, and a first support portion. The crucible has a top surface, a bottom surface opposite to the top surface, and a tubular side surface located between the top surface and the bottom surface. The first resistive heater is disposed to face the bottom surface. The second resistive heater is provided to surround the side surface. The first support portion supports the crucible such that the bottom surface is separated from the first resistive heater, and the side surface is separated from the second resistive heater. The first support portion is in contact with at least one of the top surface and the side surface.

14 Claims, 13 Drawing Sheets

(56) References Cited

FOREIGN PATENT DOCUMENTS

| JP | 2000264793 | A | * | 9/2000 |
|----|------------|---|---|--------|
| JP | 2000264793 | A | * | 9/2000 |
| JP | 2007-186787 | A | | 7/2007 |
| JP | 2008290885 | A | * | 12/2008 |
| JP | 2008290885 | A | * | 12/2008 |
| JP | 2012-030994 | A | | 2/2012 |
| JP | 2012-510951 | A | | 5/2012 |
| WO | WO-2010/077639 | A2 | | 7/2010 |
| WO | WO 2013/159083 | A1 | | 10/2013 |

* cited by examiner

DEVICE OF MANUFACTURING SILICON CARBIDE SINGLE CRYSTAL

BACKGROUND OF THE INVENTION

Field of the Invention

The present disclosure relates to devices of manufacturing silicon carbide single crystals.

Description of the Background Art

In recent years, silicon carbide has been increasingly employed as a material for a semiconductor device in order to allow for higher breakdown voltage, lower loss and the like of the semiconductor device. Japanese National Patent Publication No. 2012-510951 describes a method of manufacturing a silicon carbide single crystal by sublimation using a crucible made of graphite. A resistive heater is provided on each of upper and lower sides of the crucible.

SUMMARY OF THE INVENTION

A device of manufacturing a silicon carbide single crystal according to the present disclosure includes a crucible, a first resistive heater, a second resistive heater, and a support portion. The crucible has a top surface, a bottom surface opposite to the top surface, and a tubular side surface located between the top surface and the bottom surface. The first resistive heater is disposed to face the bottom surface. The second resistive heater is provided to surround the side surface. The support portion is provided such that the bottom surface is separated from the first resistive heater, and the side surface is separated from the second resistive heater. The support portion is in contact with at least one of the top surface and the side surface.

A device of manufacturing a silicon carbide single crystal according to the present disclosure is a device of manufacturing a silicon carbide single crystal with a sublimation method, which includes a crucible, a first resistive heater, a second resistive heater, a third resistive heater, and a support portion. The crucible has a top surface, a bottom surface opposite to the top surface, and a tubular side surface located between the top surface and the bottom surface. The first resistive heater is disposed to face the bottom surface. The second resistive heater is provided to surround the side surface. The third resistive heater is disposed to face the top surface. The support portion supports the crucible such that the bottom surface is separated from the first resistive heater, the side surface is separated from the second resistive heater, and the top surface is separated from the third resistive heater. The second resistive heater has a first surface located on the side close to the top surface, and a second surface located on the side close to the bottom surface, in a direction from the top surface toward the bottom surface. The first surface is disposed to face the support portion. When viewed along a direction parallel to the bottom surface, a width of the first resistive heater is greater than a width of internal space of the crucible. The support portion is in contact with an entire circumference of the side surface. The second surface of the second resistive heater is located between the bottom surface and the top surface in the direction from the top surface toward the bottom surface.

DETAILED DESCRIPTION OF THE INVENTION

Figure 1:
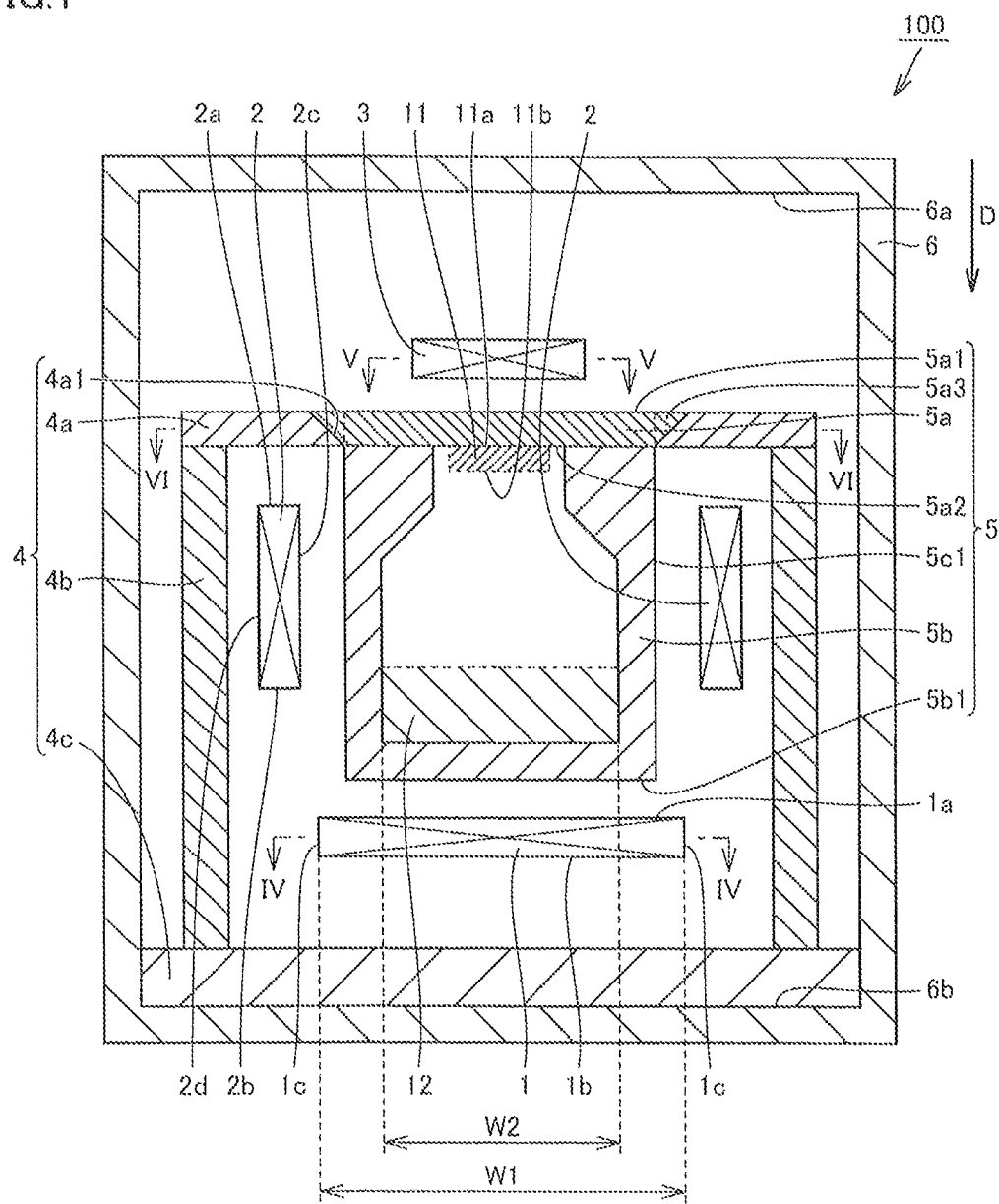
FIG. 1 is a schematic vertical sectional view showing the configuration of a device of manufacturing a silicon carbide single crystal according to an embodiment.

When heating a crucible using a resistive heater, the resistive heater is provided separately from the crucible in order to prevent a current flow to the crucible. In order to support the crucible separately from the resistive heater, it is conceivable to provide a support portion on the bottom surface side of the crucible to place and support the crucible on the support portion. When the support portion is disposed on the bottom surface side of the crucible, however, the resistive heater needs to be disposed while avoiding the support portion. This results in difficulty in maintaining a uniform temperature of the crucible in a plane parallel to the bottom surface of the crucible.

The present inventors thus conceived of providing a support portion in contact with at least one of a top surface and a side surface of a crucible. This eliminates the need to provide the support portion on the bottom surface side of the crucible, thus allowing for uniform heating of the bottom surface of the crucible by a resistive heater disposed to face the bottom surface of the crucible. As a result, in-plane uniformity of the temperature of the crucible can be improved. It is noted that the term "in-plane" refers to inside of a plane parallel to the bottom surface of the crucible.

DESCRIPTION OF EMBODIMENTS (1) A device of manufacturing a silicon carbide single crystal according to the present disclosure includes a crucible, a first resistive heater, a second resistive heater, and a support portion. The crucible has a top surface, a bottom surface opposite to the top surface, and a tubular side surface located between the top surface and the bottom surface. The first resistive heater is disposed to face the bottom surface. The second resistive heater is provided to surround the side surface. The support portion supports the crucible such that the bottom surface is separated from the first resistive heater, and the side surface is separated from the second resistive heater. The support portion is in contact with at least one of the top surface and the side surface. Accordingly, in-plane uniformity of a temperature of the crucible can be improved. As a result, the crystal quality of the silicon carbide single crystal can be improved.

(2) Preferably, in the device of manufacturing a silicon carbide single crystal according to (1) above, the second resistive heater has a first surface located on the side close to the top surface, and a second surface located on the side close to the bottom surface, in a direction from the top surface toward the bottom surface. The support portion is provided to be in contact with the side surface and to face the first surface. Accordingly, the support portion is heated by the second resistive heater, whereby escape of the heat of the crucible through the support portion can be suppressed. Thus, the in-plane uniformity of the temperature of the crucible can be further improved.

(3) Preferably, in the device of manufacturing a silicon carbide single crystal according to (2) above, the second surface is located between the bottom surface and the top surface in the direction from the top surface toward the bottom surface. Accordingly, degradation of the in-plane uniformity of the temperature of the crucible resulting from excessive heating of a portion in the vicinity of the bottom surface of the crucible by the second resistive heater can be suppressed.

(4) Preferably, in the device of manufacturing a silicon carbide single crystal according to (1) above, the second resistive heater has a first surface located on the side close to the top surface, and a second surface located on the side close to the bottom surface, in a direction from the top surface toward the bottom surface. The support portion is provided to be in contact with the side surface and to face the second surface. Accordingly, the support portion is heated by the second resistive heater, whereby escape of the heat of the crucible through the support portion can be suppressed. Thus, the in-plane uniformity of the temperature of the crucible can be further improved.

(5) Preferably, in the device of manufacturing a silicon carbide single crystal according to (1) above, the support portion is in contact with an entire circumference of the side surface. Accordingly, the in-plane uniformity of the temperature of the crucible can be further improved.

(6) Preferably, in the device of manufacturing a silicon carbide single crystal according to (1) above, the support portion is in contact with the top surface. Accordingly, flexibility in arranging wires for supplying electric power to the first resistive heater and the second resistive heater can be increased.

(7) Preferably, in the device of manufacturing a silicon carbide single crystal according to (1) above, when viewed along a direction parallel to the bottom surface, a width of the first resistive heater is greater than a width of internal space of the crucible. Accordingly, the in-plane uniformity of the temperature of the bottom surface of the crucible can be further improved.

(8) Preferably, the device of manufacturing a silicon carbide single crystal according to (1) above further includes a third resistive heater disposed to face the top surface and to be separated from the top surface. Accordingly, the temperature of a seed crystal can be accurately controlled.

(9) Preferably, in the device of manufacturing a silicon carbide single crystal according to (1) above, the silicon carbide single crystal is configured such that it can be manufactured with a sublimation method. Accordingly, the uniformity of the crystal quality of the silicon carbide single crystal manufactured with a sublimation method can be improved.

(10) Preferably, the device of manufacturing a silicon carbide single crystal according to (1) above further includes a third resistive heater disposed to face the top surface, and a control unit that controls the first resistive heater, the second resistive heater and the third resistive heater. Assuming that a temperature of the top surface is Ta, a temperature of the bottom surface is Tb, and a temperature of the side surface is Tc, the control unit is configured to control the first resistive heater, the second resistive heater and the third resistive heater so as to satisfy 2100° C.≤Tc≤2400° C. and Ta<Tb<Tc.

A sublimation method is a crystal growth process of sublimating a source material disposed at the bottom within a crucible at a high temperature, and recrystallizing the sublimated source material (gas) on a seed crystal disposed at an upper portion within the crucible. In the sublimation method, the temperature of a bottom surface of the crucible is controlled to be higher than the temperature of a top surface. When the temperature of a side surface of the crucible becomes lower than the temperature of the bottom surface, however, part of the sublimated source material may flow to the side surface having a low temperature instead of flowing to the seed crystal, and adhere to the side surface. In this case, an amount of the source material supplied to the seed crystal decreases, resulting in a decrease in growth rate of a single crystal.

For this reason, the manufacturing device according to (10) above includes the second resistive heater that heats the side surface of the crucible, in addition to the third resistive heater that heats the top surface of the crucible and the first resistive heater that heats the bottom surface of the crucible. Further, the control unit of the manufacturing device controls each resistive heater such that the side surface has the highest temperature among the top surface, the bottom surface and the side surface of the crucible. This allows the sublimated source material to be supplied to the seed crystal, thus suppressing a decrease in growth rate resulting from the flow of the sublimated source material to the side surface.

(11) Preferably, the device of manufacturing a silicon carbide single crystal according to (10) above further includes a first measurement unit that measures the temperature of the top surface, a second measurement unit that measures the temperature of the bottom surface, and a third measurement unit that measures the temperature of the side surface. The purpose of this is to reflect the measurement results of the temperatures of the top surface, the bottom surface and the side surface in the temperature control.

(12) Preferably, in the device of manufacturing a silicon carbide single crystal according to (11) above, the second resistive heater is provided in a position overlapping with a measurement position on the side surface of the third measurement unit in a direction from the top surface toward the bottom surface. The purpose of this is to accurately perform the temperature control of the side surface.

(13) Preferably, in the device of manufacturing a silicon carbide single crystal according to (12) above, the measurement position on the side surface is located at a distance of 20 mm or more and 100 mm or less from the top surface in the direction from the top surface toward the bottom surface. The purpose of this is to measure the temperature of the side surface in a position corresponding to space where the sublimated source material is transferred, and perform the temperature control of the side surface based on the measurement.

(14) Preferably, the device of manufacturing a silicon carbide single crystal according to (11) above further includes a heat insulator provided on an outer side of the second resistive heater when viewed from the crucible, the heat insulator having a through hole in a position corresponding to the third measurement unit. By disposing the third measurement unit on an outer side of the heat insulator, the third measurement unit can be protected against high temperature by the heat insulator.

(15) A device of manufacturing a silicon carbide single crystal according to the present disclosure is a device of manufacturing a silicon carbide single crystal with a sublimation method, which includes a crucible, a first resistive heater, a second resistive heater, a third resistive heater, and a support portion. The crucible has a top surface, a bottom surface opposite to the top surface, and a tubular side surface located between the top surface and the bottom surface. The first resistive heater is disposed to face the bottom surface. The second resistive heater is provided to surround the side surface. The third resistive heater is disposed to face the top surface. The support portion supports the crucible such that the bottom surface is separated from the first resistive heater, the side surface is separated from the second resistive heater, and the top surface is separated from the third resistive heater. The second resistive heater has a first surface located on the side close to the top surface, and a second surface located on the side close to the bottom surface, in a direction from the top surface toward the bottom surface. The first surface is disposed to face the support portion. When viewed along a direction parallel to the bottom surface, a width of the first resistive heater is greater than a width of internal space of the crucible. The support portion is in contact with an entire circumference of the side surface. The second surface of the second resistive heater is located between the bottom surface and the top surface in the direction from the top surface toward the bottom surface. Accordingly, in-plane uniformity of a temperature of the crucible can be further improved.

DETAILS OF EMBODIMENTS

Embodiments will be described below with reference to the drawings. In the following drawings, the same or corresponding parts are designated by the same reference numbers and description thereof will not be repeated. Regarding crystallographic denotation herein, an individual orientation, a group orientation, an individual plane, and a group plane are shown in [ ], < >, ( ), and { }, respectively. Although a crystallographically negative index is normally expressed by a number with a bar "-" thereabove, a negative sign herein precedes a number to indicate a crystallographically negative index.

First, the configuration of a device 100 of manufacturing a silicon carbide single crystal according to an embodiment is described.

As shown in FIG. 1, device 100 of manufacturing a silicon carbide single crystal according to this embodiment is a device for manufacturing a silicon carbide single crystal with a sublimation method, which mainly includes a crucible 5, a first resistive heater 1, a second resistive heater 2, a third resistive heater 3, a support portion 4, and a heat insulator 6.

[Crucible]

Crucible 5 has a top surface 5a1, a bottom surface 5b1 opposite to top surface 5a1, and a tubular side surface 5c1 located between top surface 5a1 and bottom surface 5b1. Side surface 5c1 has a cylindrical shape, for example. Crucible 5 has a pedestal 5a configured to be able to hold a seed crystal 11, and an accommodation portion 5b having the shape of a bottomed tube and configured to be able to accommodate a silicon carbide source material 12. Pedestal 5a has a seed crystal holding surface 5a2 in contact with a backside surface 11a of seed crystal 11, and top surface 5a1 opposite to seed crystal holding surface 5a2. Pedestal 5a forms top surface 5a1. Accommodation portion 5b forms bottom surface 5b1. Side surface 5c1 is formed of pedestal 5a and accommodation portion 5b. Accommodation portion 5b may form bottom surface 5b1 and side surface 5c1. In crucible 5, a silicon carbide single crystal is grown on a surface 11b of seed crystal 11 by sublimating silicon carbide source material 12 and recrystallizing the source material on surface 11b of seed crystal 11. That is, the silicon carbide single crystal is configured such that it can be manufactured with a sublimation method.

[Resistive Heater]

First resistive heater 1 is disposed to face bottom surface 5b1 of crucible 5. First resistive heater 1 is separated from bottom surface 5b1. First resistive heater 1 has an upper surface 1a facing bottom surface 5b1, and a lower surface 1b opposite to upper surface 1a. Second resistive heater 2 is provided to surround side surface 5c1 of crucible 5. Second resistive heater 2 is separated from side surface 5c1. The second resistive heater includes, in a direction from bottom surface 5b1 toward top surface 5a1, a first surface 2a located on the side close to top surface 5a1, a second surface 2b located on the side close to bottom surface 5b1, a third surface 2c facing side surface 5c1, and a fourth surface 2d opposite to third surface 2c. Preferably, second surface 2b of second resistive heater 2 is located between bottom surface 5b1 and top surface 5a1 in a direction from top surface 5a1 toward bottom surface 5b1. Third resistive heater 3 is disposed to face top surface 5a1. Third resistive heater 3 is separated from top surface 5a1.

Figure 2:
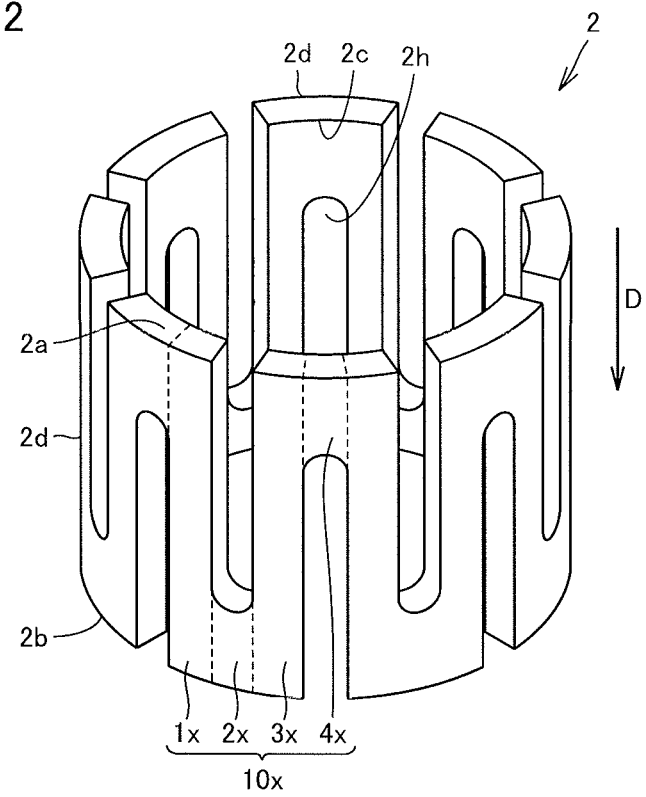
FIG. 2 is a schematic perspective view showing the configuration of a second resistive heater.

As shown in FIGS. 1 and 2, second resistive heater 2 has a first portion ix extending along a direction D from top surface 5a1 toward bottom surface 5b1 of crucible 5, a second portion 2x provided continuously with first portion 1x on the bottom surface 5b1 side and extending along a circumferential direction of side surface 5c1, a third portion 3x provided continuously with second portion 2x and extending along the direction from bottom surface 5b1 toward top surface 5a1, and a fourth portion 4x provided continuously with third portion 3x on the top surface 5a1 side and extending along the circumferential direction of side surface 5c1. First portion 1x, second portion 2x, third portion 3x and fourth portion 4x form a heater unit 10x. Second resistive heater 2 is arranged in an annular shape by successively providing a plurality of heater units 10x.

Figure 3:
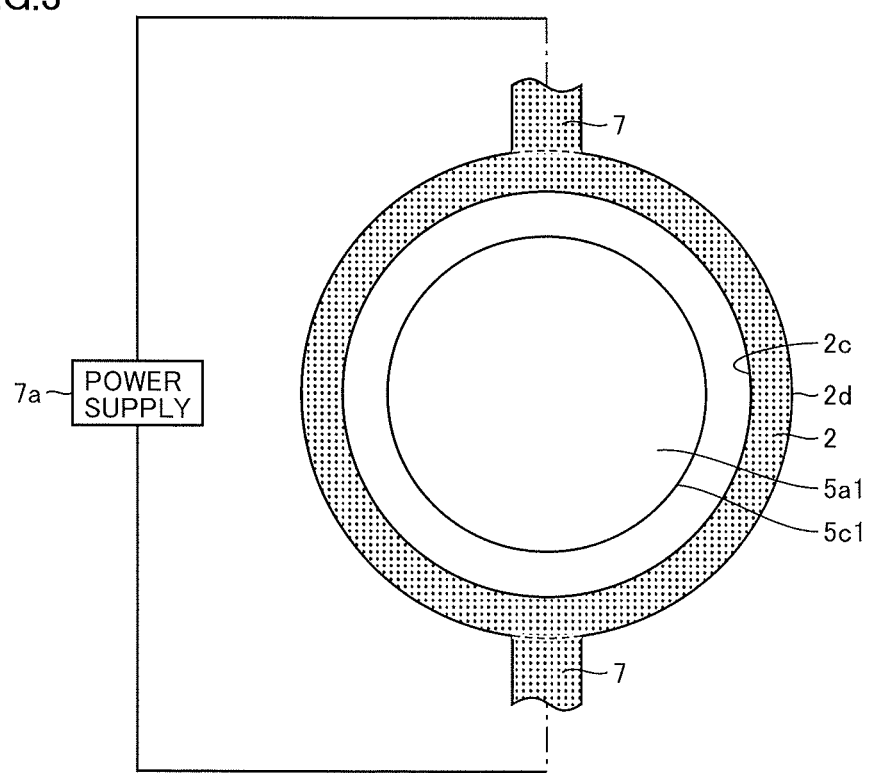
FIG. 3 is a schematic plan view showing the configuration of the second resistive heater and electrodes.

FIG. 3 is a schematic diagram showing positional relation between second resistive heater 2 and crucible 5 when viewed along direction D from top surface 5a1 toward bottom surface 5b1. In FIG. 3, the normal direction of the sheet of the drawing corresponds to direction D in FIG. 2. As shown in FIG. 3, when viewed along direction D from top surface 5a1 toward bottom surface 5b1, second resistive heater 2 is provided to surround side surface 5c1 and has an annular shape (ring shape). A pair of electrodes 7 is provided in contact with fourth surface 2d of second resistive heater 2. When viewed along a direction perpendicular to top surface 5a1, the pair of electrodes 7 and the center of top surface 5a1 may be aligned with each other. The pair of electrodes 7 is connected to a second power supply 7a. Second power supply 7a is configured to be able to supply electric power to second resistive heater 2. Put another way, second resistive heater 2 is connected to second power supply 7a, and receives a supply of electric power from second power supply 7a. Preferably, second resistive heater 2 forms a parallel circuit.

Figure 4:
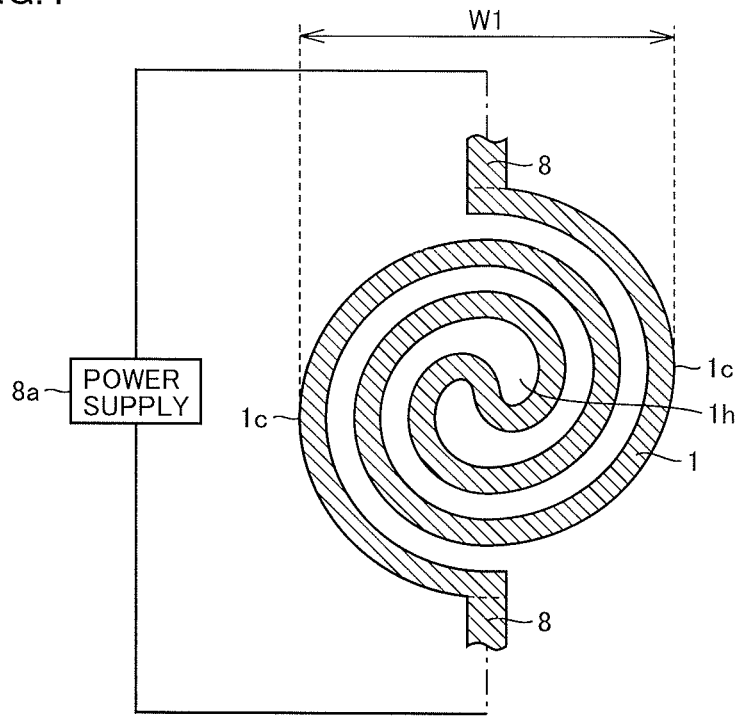
FIG. 4 is a schematic transverse sectional view taken along line IV-IV in a direction of arrows in FIG. 1, which shows the configuration of a first resistive heater and electrodes.

As shown in FIG. 4, when viewed along the direction from top surface 5a1 toward bottom surface 5b1, first resistive heater 1 has a shape made of two curves which move away from a center while whirling and meet each other at the center. Preferably, first resistive heater 1 has the shape of a Fermat's spiral. A pair of electrodes 8 is connected across first resistive heater 1. The pair of electrodes 8 is connected to a first power supply 8a. First power supply 8a is configured to be able to supply electric power to first resistive heater 1. Put another way, first resistive heater 1 is connected to first power supply 8a, and receives a supply of electric power from first power supply 8a. When viewed along a direction parallel to bottom surface 5b1, a width W1 of first resistive heater 1 is greater than a width W2 of the interior of crucible 5 (see FIG. 1), and preferably greater than a width of bottom surface 5b1. Width W1 of first resistive heater 1 is measured exclusive of electrodes 8.

Figure 5:
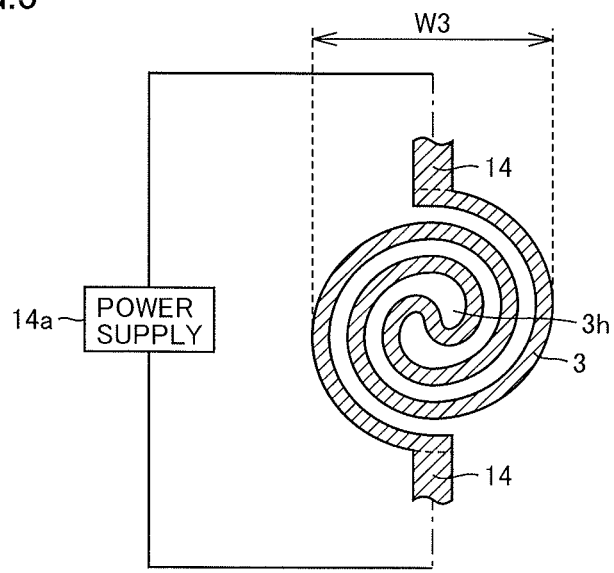
FIG. 5 is a schematic transverse sectional view taken along line V-V in a direction of arrows in FIG. 1, which shows the configuration of a third resistive heater and electrodes.

As shown in FIG. 5, when viewed along the direction from top surface 5a1 toward bottom surface 5b1, third resistive heater 3 has a shape made of two curves which move away from a center while whirling and meet each other at the center. Preferably, third resistive heater 3 has the shape of a Fermat's spiral. A pair of electrodes 14 is connected across third resistive heater 3. The pair of electrodes 14 is connected to a third power supply 14a. Third power supply 14a is configured to be able to supply electric power to third resistive heater 3. Put another way, third resistive heater 3 is connected to third power supply 14a, and receives a supply of electric power from third power supply 14a. When viewed along a direction parallel to top surface 5a1, a width W3 of third resistive heater 3 is preferably smaller than a width of top surface 5a1 and greater than an inner diameter of the opening of accommodation portion 5b (a width W4 in FIG. 13). The width of third resistive heater 3 is measured exclusive of electrodes 14. Each resistive heater is configured to be able to generate heat with the electric power supplied from the power supply, and heat crucible 5 by heat radiation.

As shown in FIG. 1, support portion 4 may have a first support portion 4a, a second support portion 4b, and a mount portion 4c. Pedestal 5a of crucible 5 may have a projection 5a3 projecting outward relative to side surface 5c1 of accommodation portion 5b. Preferably, projection 5a3 is provided on an entire circumference of side surface 5c1 of pedestal 5a. Preferably, a sidewall 4a1 of first support portion 4a forms an opening. Accommodation portion 5b of crucible 5 is lowered through the opening from above the opening. Projection 5a3 of pedestal 5a is in contact with sidewall 4a1 of first support portion 4a. With projection 5a3 of crucible 5 engaging with sidewall 4a1 of first support portion 4a, crucible 5 is supported by first support portion 4a. When viewed along the direction parallel to top surface 5a1, sidewall 4a1 of first support portion 4a may be inclined relative to top surface 5a1.

First support portion 4a supports crucible 5 such that bottom surface 5b1 of crucible 5 is separated from first resistive heater 1, and side surface 5c1 is separated from second resistive heater 2. Preferably, first support portion 4a supports crucible 5 such that bottom surface 5b1 is separated from first resistive heater 1, side surface 5c1 is separated from second resistive heater 2, and top surface 5a1 is separated from third resistive heater 3.

First support portion 4a is in contact with side surface 5c1 of pedestal 5a. Preferably, first support portion 4a is configured separately from crucible 5. That is, crucible 5 is configured to be removable from first support portion 4a. First support portion 4a may extend in the direction parallel to top surface 5a1 of crucible 5. Preferably, first surface 2a of second resistive heater 2 is disposed to face first support portion 4a. When viewed along a direction perpendicular to bottom surface 5b1, first support portion 4a may be provided to overlap with second resistive heater 2.

Figure 6:
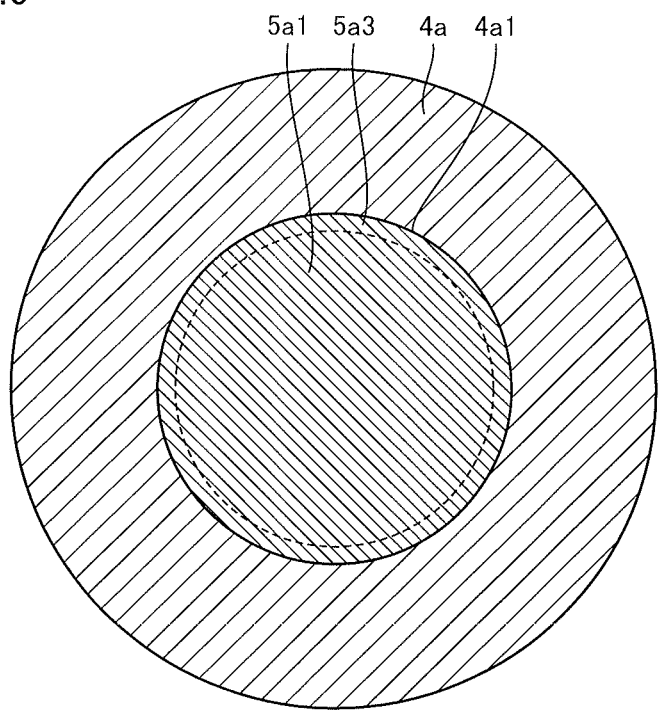
FIG. 6 is a schematic transverse sectional view taken along line VI-VI in a direction of arrows in FIG. 1, which shows the configuration of a support portion and a pedestal.

As shown in FIG. 6, first support portion 4a is preferably in contact with the entire circumference of side surface 5c1 of crucible 5. When viewed along the direction from top surface 5a1 toward bottom surface 5b1, first support portion 4a is provided to surround projection 5a3 of pedestal 5a. When viewed along the direction from top surface 5a1 toward bottom surface 5b1, first support portion 4a has a ring shape. First support portion 4a may be in contact with only a portion of the circumference of projection 5a3 of pedestal 5a. When viewed along the direction from top surface 5a1 toward bottom surface 5b1, sidewall 4a1 of first support portion 4a may form a round opening.

As shown in FIG. 1, second support portion 4b is in contact with and supports first support portion 4a. Second support portion 4b extends in a direction parallel to the direction from top surface 5a1 toward bottom surface 5b1 of crucible 5, and connects first support portion 4a to mount portion 4c. Second support portion 4b is disposed to face fourth surface 2d of second resistive heater 2 and a side surface 1c of first resistive heater 1. Second support portion 4b is provided between second resistive heater 2 and heat insulator 6. Preferably, when viewed along the direction from top surface 5a1 toward bottom surface 5b1, second support portion 4b is provided to surround second resistive heater 2 and first resistive heater 1. Mount portion 4c is provided between first resistive heater 1 and heat insulator 6. Mount portion 4c faces lower surface 1b of first resistive heater 1, and is in contact with a lower surface 6b of heat insulator 6. Mount portion 4c supports second support portion 4b. Second support portion 4b may be in direct contact with lower surface 6b of heat insulator 6. Heat insulator 6 accommodates crucible 5, first resistive heater 1, second resistive heater 2, third resistive heater 3, and support portion 4.

It is noted that each of crucible 5, first resistive heater 1, second resistive heater 2, third resistive heater 3, support portion 4 and heat insulator 6 is made of carbon, for example, and preferably made of graphite. Each of electrodes 7, 8 and 14 may be made of carbon (preferably graphite), for example, or may be made of metal such as copper. Heat insulator 6 may be formed of fibrous carbon strands, as with a felt. Heat insulator 6 may have a carbon density lower than the carbon density of support portion 4. Crucible 5, first resistive heater 1, second resistive heater 2, third resistive heater 3, support portion 4 and heat insulator 6 may contain an impurity which is inevitably mixed therein during the manufacturing process. The impurity as used herein refers to, for example, a metal or the like resulting from a cutting tool or the like used during the manufacture.

(First Variation)

Next, the configuration of a first variation of device 100 of manufacturing a silicon carbide single crystal according to this embodiment is described.

Figure 7:
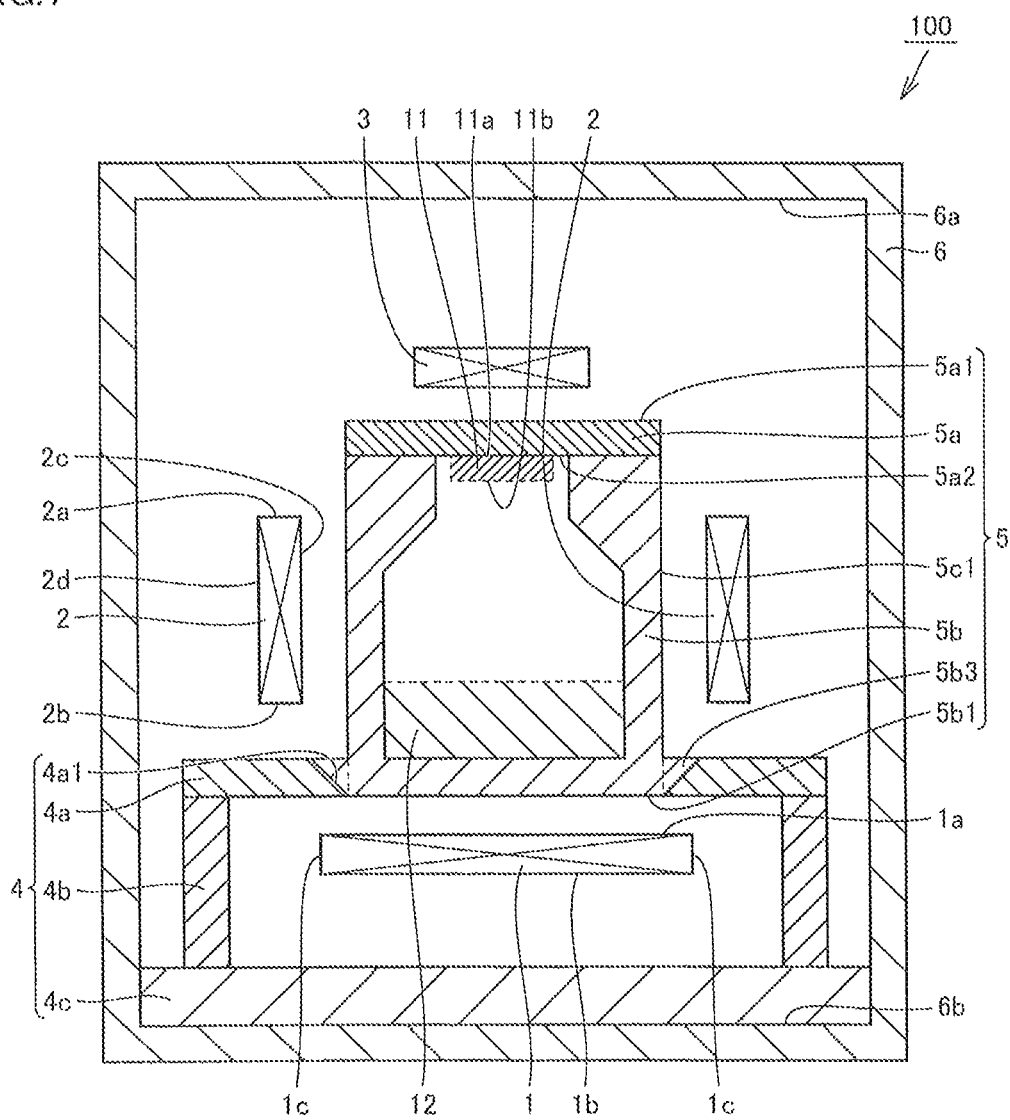
FIG. 7 is a schematic vertical sectional view showing the configuration of a first variation of the device of manufacturing a silicon carbide single crystal according to the embodiment.

As shown in FIG. 7, first support portion 4a may be provided on side surface 5c1 at the bottom surface 5b1 side of crucible 5. Accommodation portion 5b may have a projection 5b3 projecting outward relative to side surface 5c1 of pedestal 5a. Preferably, projection 5b3 is provided on the entire circumference of side surface 5c1 of accommodation portion 5b. Preferably, sidewall 4a1 of first support portion 4a forms an opening. Projection 5b3 of pedestal 5a is in contact with sidewall 4a1 of first support portion 4a. With projection 5b3 of crucible 5 engaging with sidewall 4a1 of first support portion 4a, crucible 5 is supported by first support portion 4a. When viewed along the direction parallel to bottom surface 5b1, sidewall 4a1 of first support portion 4a may be inclined relative to bottom surface 5b1.

First support portion 4a is in contact with side surface 5c1 of accommodation portion 5b of crucible 5. First support portion 4a extends in the direction parallel to bottom surface 5b1. Preferably, second surface 2b of second resistive heater 2 is disposed to face first support portion 4a. When viewed along the direction perpendicular to bottom surface 5b1, first support portion 4a may be provided to overlap with the second resistive heater.

As shown in FIG. 7, second support portion 4b may be disposed to face first resistive heater 1. Second support portion 4b is provided between first resistive heater 1 and heat insulator 6. Preferably, when viewed along the direction from top surface 5a1 toward bottom surface 5b1, second support portion 4b is provided to surround first resistive heater 1.

(Second Variation)

Next, the configuration of a second variation of device 100 of manufacturing a silicon carbide single crystal according to this embodiment is described.

Figure 8:
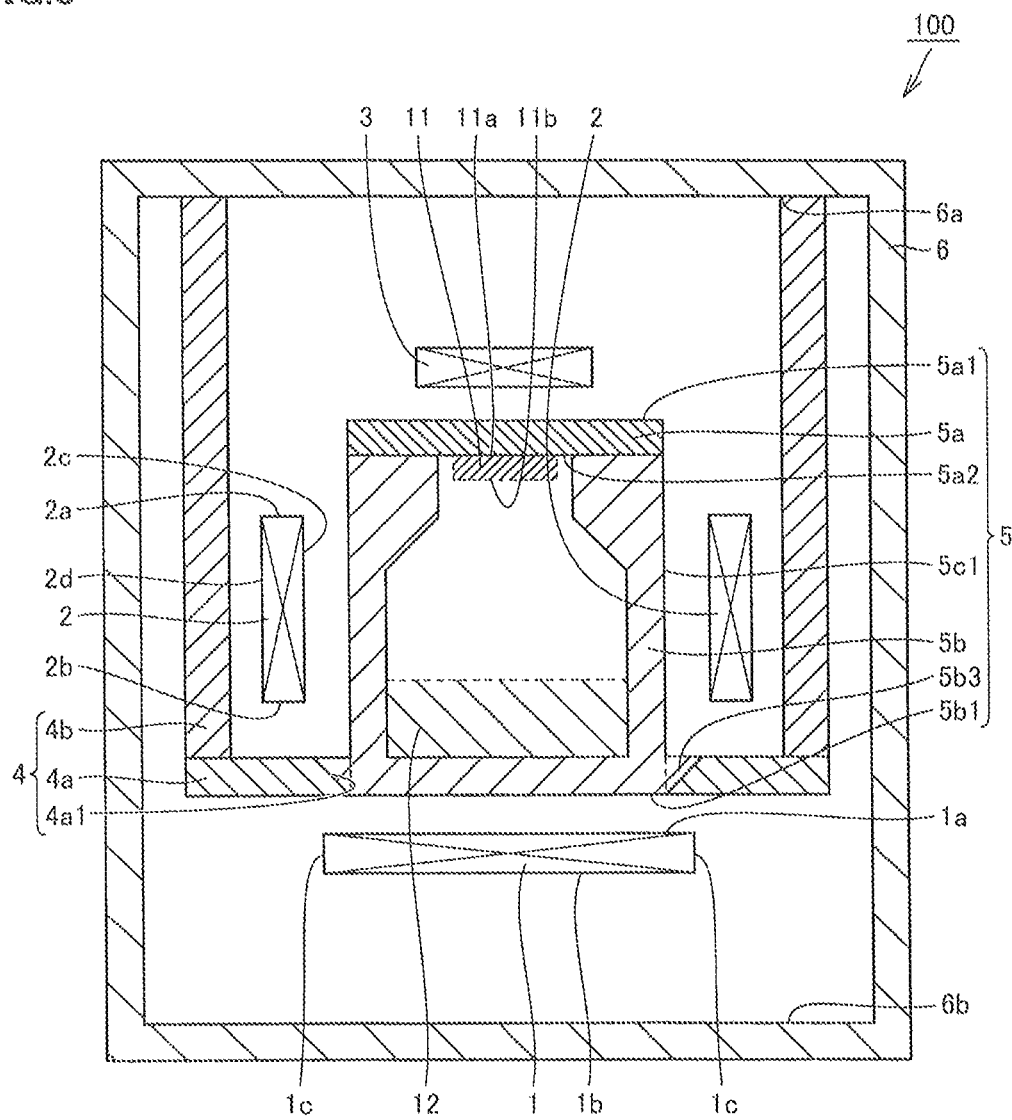
FIG. 8 is a schematic vertical sectional view showing the configuration of a second variation of the device of manufacturing a silicon carbide single crystal according to the embodiment.

As shown in FIG. 8, second support portion 4b may connect first support portion 4a in contact with side surface 5c1 of accommodation portion 5b to an upper surface 6a of heat insulator 6, to suspend crucible 5 with first support portion 4a interposed therebetween. Second support portion 4b is disposed to face fourth surface 2d of second resistive heater 2 and a side surface of third resistive heater 3. Preferably, when viewed along the direction from top surface 5a1 toward bottom surface 5b1, second support portion 4b is provided to surround second resistive heater 2 and third resistive heater 3.

(Third Variation)

Next, the configuration of a third variation of device 100 of manufacturing a silicon carbide single crystal according to this embodiment is described.

Figure 9:
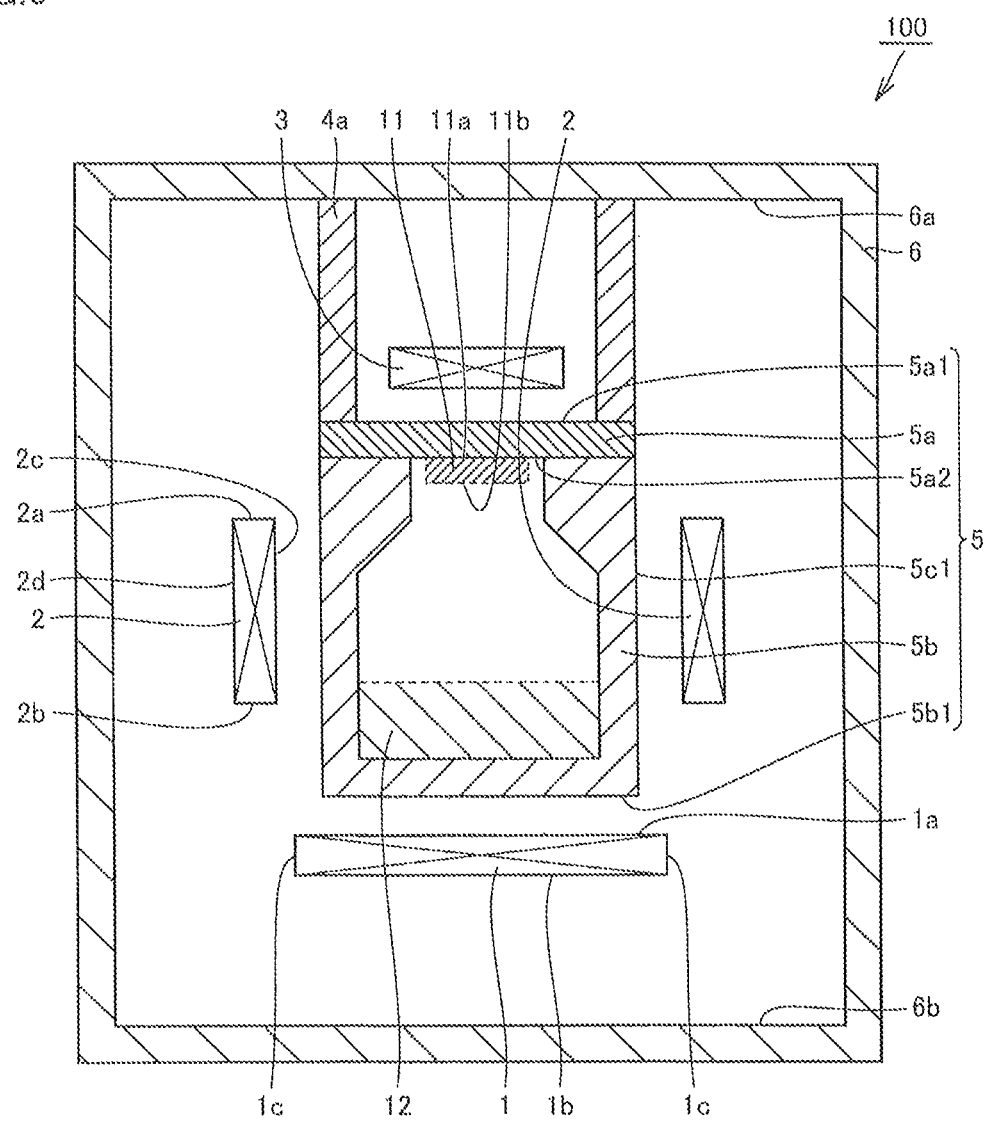
FIG. 9 is a schematic vertical sectional view showing the configuration of a third variation of the device of manufacturing a silicon carbide single crystal according to the embodiment.

As shown in FIG. 9, first support portion 4a may be in contact with top surface 5a1 of crucible 5. First support portion 4a may connect top surface 5a1 to upper surface 6a of heat insulator 6, to suspend crucible 5. First support portion 4a is disposed to face the side surface of third resistive heater 3. Preferably, when viewed along the direction from top surface 5a1 toward bottom surface 5b1, first support portion 4a is provided to surround third resistive heater 3. Preferably, first support portion 4a is provided to extend along side surface 5c1.

(Fourth Variation)

Next, the configuration of a fourth variation of device 100 of manufacturing a silicon carbide single crystal according to this embodiment is described.

Figure 10:
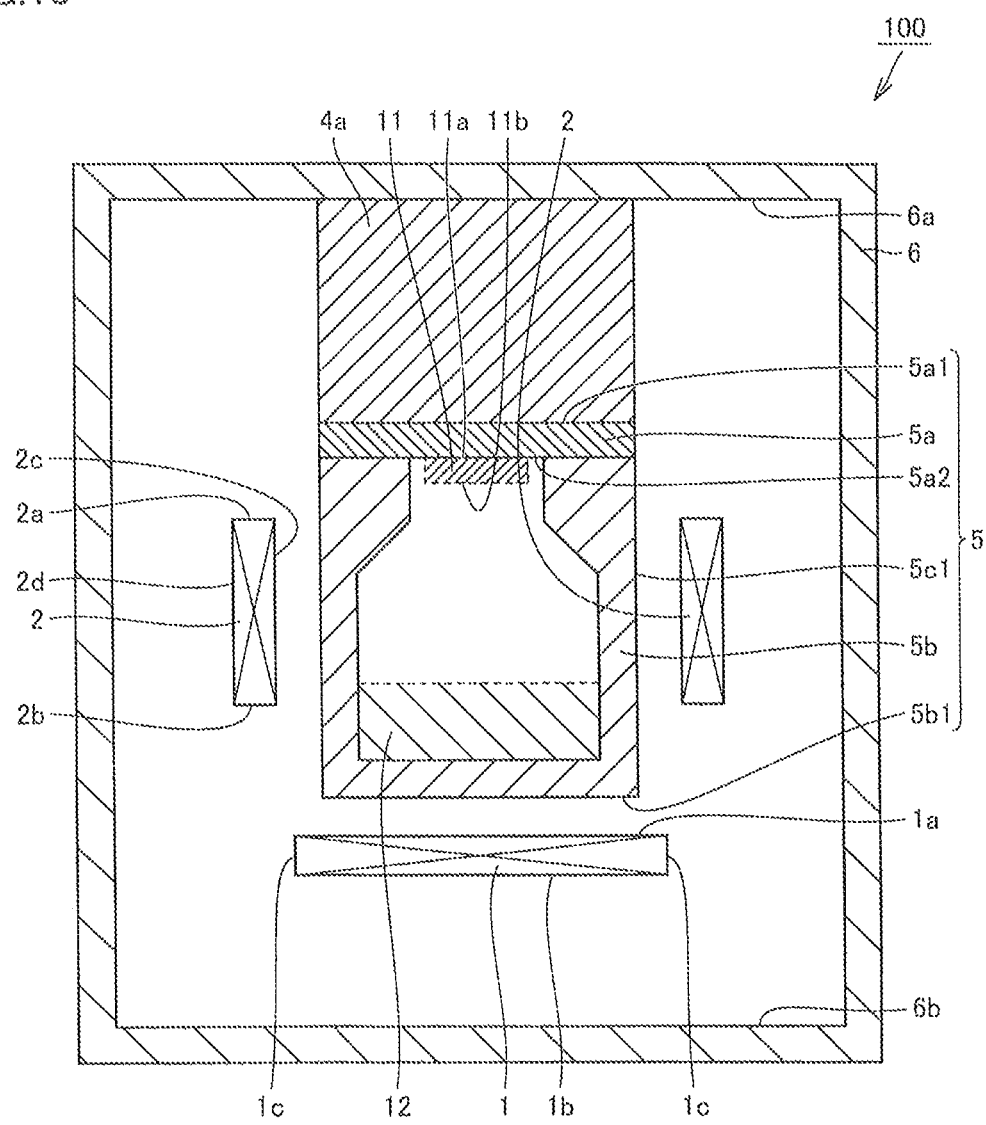
FIG. 10 is a schematic vertical sectional view showing the configuration of a fourth variation of the device of manufacturing a silicon carbide single crystal according to the embodiment.

As shown in FIG. 10, first support portion 4a may be in contact with the entire top surface 5a1 of crucible 5. Third resistive heater 3 may not be provided. First support portion 4a may be provided in contact with the center of top surface 5a1 and not in contact with the outer circumference of top surface 5a1. First support portion 4a may connect the center of top surface 5a1 to upper surface 6a of heat insulator 6, to suspend crucible 5.

(Fifth Variation)

Next, the configuration of a fifth variation of device 100 of manufacturing a silicon carbide single crystal according to this embodiment is described.

Figure 11:
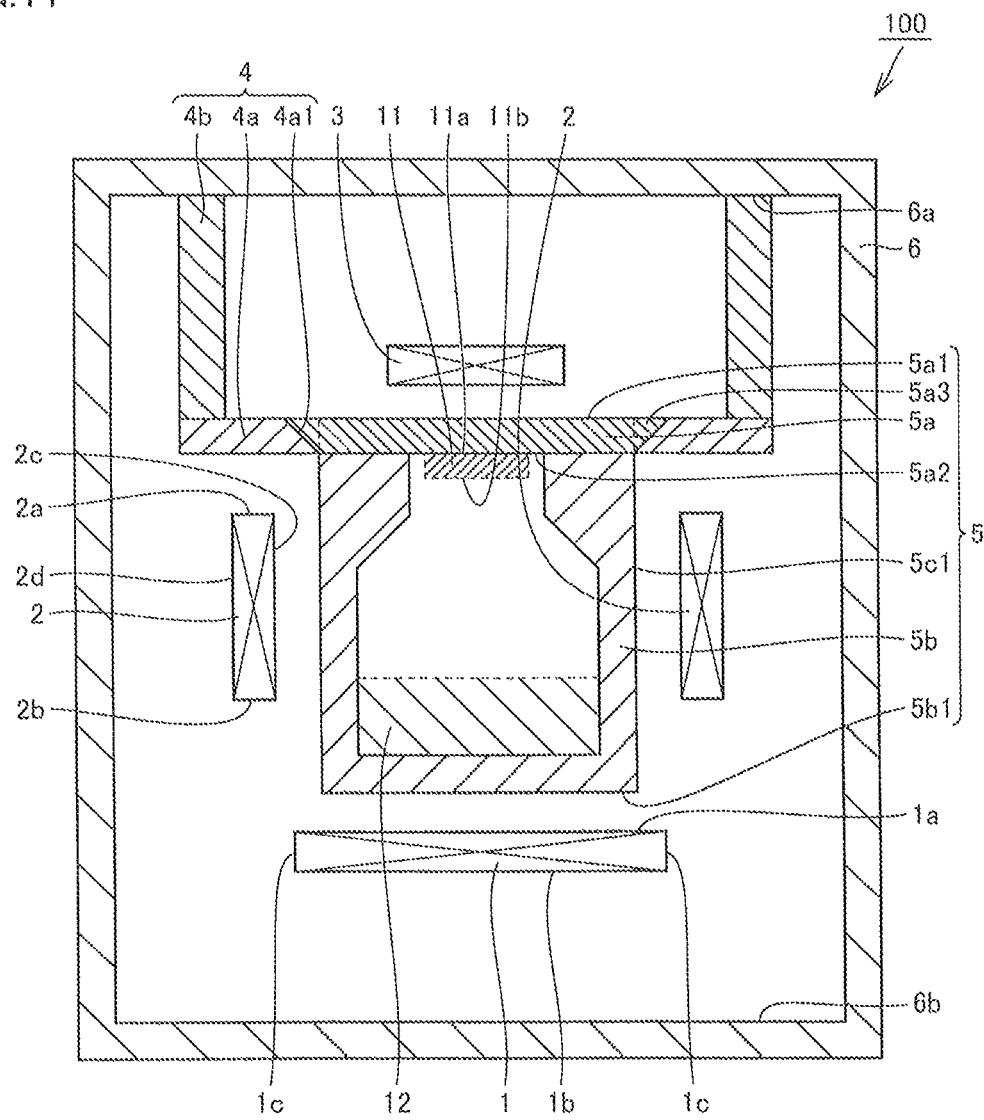
FIG. 11 is a schematic vertical sectional view showing the configuration of a fifth variation of the device of manufacturing a silicon carbide single crystal according to the embodiment.

As shown in FIG. 11, second support portion 4b may connect first support portion 4a in contact with side surface 5c1 of pedestal 5a to upper surface 6a of heat insulator 6, to suspend crucible 5 with first support portion 4a interposed therebetween. Second support portion 4b is disposed to face the side surface of third resistive heater 3, without facing fourth surface 2d of second resistive heater 2. Preferably, when viewed along the direction from top surface 5a1 toward bottom surface 5b1, second support portion 4b is provided to surround third resistive heater 3.

As descried above, first support portion 4a is provided in contact with at least one of top surface 5a1 and side surface 5c1 of crucible 5. That is, first support portion 4a may support crucible 5 while being in contact with only one of top surface 5a1 and side surface 5c1, or may support crucible 5 while being in contact with both top surface 5a1 and side surface 5c1.

(Sixth Variation)

Next, the configuration of a sixth variation of device 100 of manufacturing a silicon carbide single crystal according to this embodiment is described.

Figure 12:
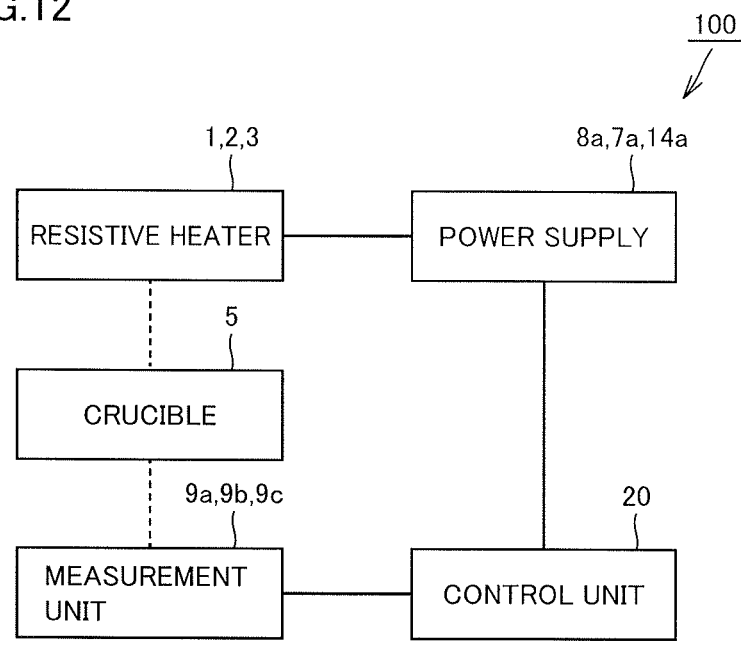
FIG. 12 is a conceptual diagram showing the configuration of a sixth variation of the device of manufacturing a silicon carbide single crystal according to the embodiment.

FIG. 12 is a conceptual diagram showing an example of the configuration of manufacturing device 100. As shown in FIG. 12, manufacturing device 100 mainly includes crucible 5, the resistive heater (first resistive heater 1, second resistive heater 2 and third resistive heater 3), a measurement unit (a first measurement unit 9a, a second measurement unit 9b and a third measurement unit 9c), the power supply (first power supply 8a, second power supply 7a and third power supply 14a), and a control unit 20. Control unit 20 determines an amount of electric power to be supplied to the resistive heater, and provides a command to the power supply. The power supply supplies electric power to the resistive heater based on the command from the control unit. The resistive heater is resistively heated in response to the supply of electric power, and heats crucible 5 by heat radiation. As will be described later, in this embodiment, assuming that a temperature of top surface 5a1 of crucible 5 shown in FIG. 13 is Ta, a temperature of bottom surface 5b1 of crucible 5 is Tb, and a temperature of side surface 5c1 of crucible 5 is Tc, control unit 20 shown in FIG. 12 controls the resistive heater so as to satisfy 2100° C.≤Tc≤2400° C. and Ta<Tb<Tc, thereby suppressing a decrease in growth rate.

As shown in FIG. 12, manufacturing device 100 may include the measurement unit in order to accurately perform the temperature control of crucible 5. In this case, the measurement unit measures the temperature of crucible 5 in a predetermined measurement position, and transmits the measurement result to control unit 20. Control unit 20 adjusts the amount of electric power to be supplied to the resistive heater based on the measurement result from the measurement unit. That is, control unit 20 performs feedback control. In this embodiment, however, the control is only required to satisfy the above relation among temperatures Ta, Tb and Tc, and the measurement unit is not a requirement. The configuration of manufacturing device 100 will be described below in more detail.

Figure 13:
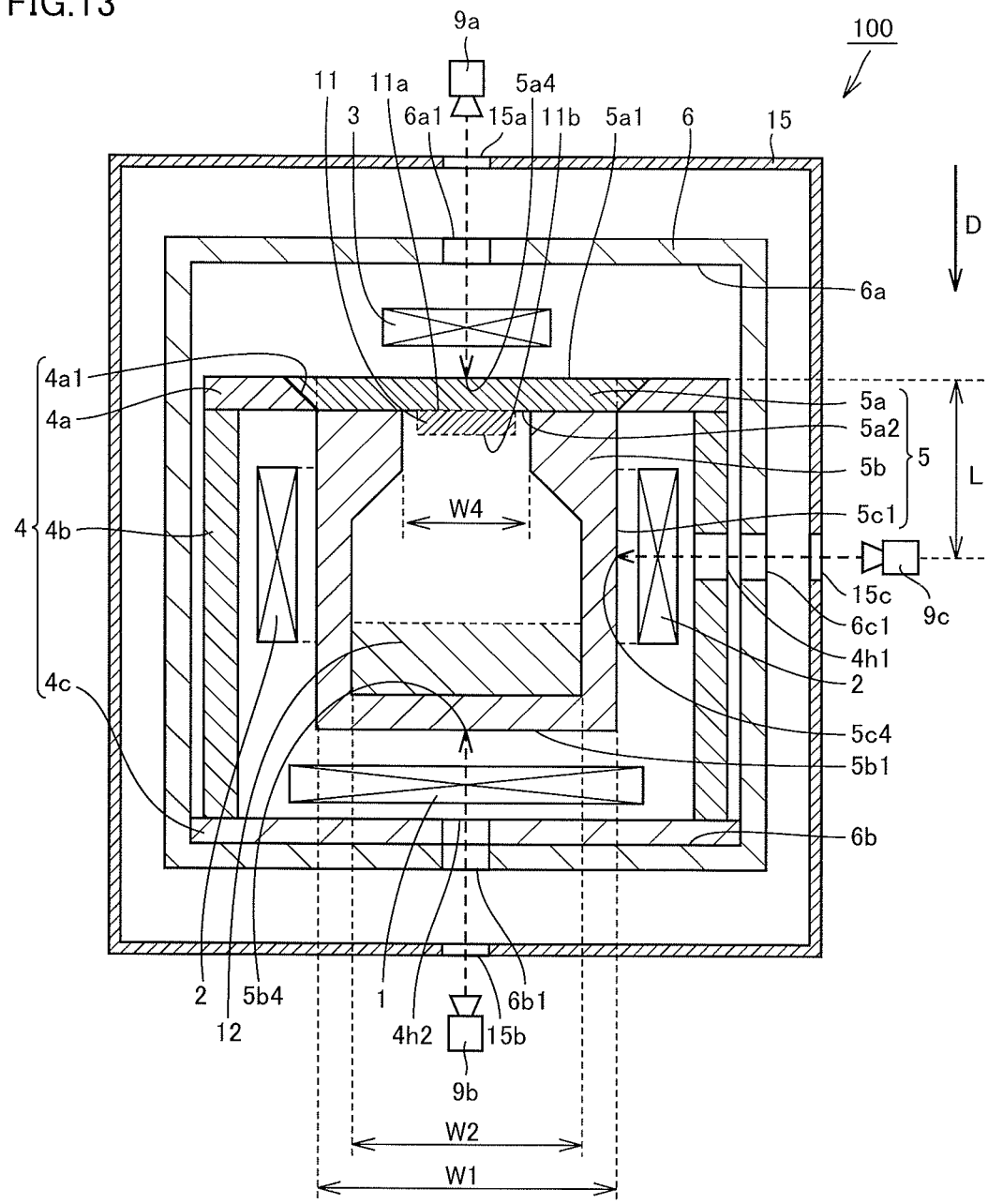
FIG. 13 is a schematic vertical sectional view showing the configuration of the sixth variation of the device of manufacturing a silicon carbide single crystal according to the embodiment.

FIG. 13 is a schematic sectional view showing an example of the configuration of manufacturing device 100. As shown in FIG. 13, manufacturing device 100 includes a chamber 15, in which crucible 5, first resistive heater 1, second resistive heater 2, third resistive heater 3, heat insulator 6, and support portion 4 are provided. Heat insulator 6, support portion 4, crucible 5, and each resistive heater are made of graphite, for example. Manufacturing device 100 includes first measurement unit 9a, second measurement unit 9b and third measurement unit 9c outside chamber 15.

As shown in FIG. 13, heat insulator 6 is provided on the outer side of each resistive heater when viewed from crucible 5. In addition, chamber 15 is provided on the outer side of heat insulator 6. Support portion 4 is provided on the inner side of heat insulator 6. First measurement unit 9a, second measurement unit 9b and third measurement unit 9c are provided on the outer side of chamber 15, and protected against high temperature by heat insulator 6.

A pyrometer is used, for example, as each measurement unit. For example, a pyrometer manufactured by CHINO Corporation (model number: IR-CAH8TN6) is suitable for use. The pyrometer may have measurement wavelengths of 1.55 μm and 0.9 μm, for example. The pyrometer has a set value for emissivity of 0.9, for example, and a distance coefficient of 300, for example. A measurement diameter of the pyrometer is determined by dividing a measurement distance by the distance coefficient. If the measurement distance is 900 mm, for example, then the measurement diameter is 3 mm.

As shown in FIG. 13, first measurement unit 9a is disposed to face top surface 5a1, and configured to be able to measure temperature Ta of top surface 5a1. On a straight line connecting a measurement position 5a4 on top surface 5a1 to first measurement unit 9a, chamber 15 is provided with a view port 15a, and heat insulator 6 is provided with a through hole 6a1. View port 15a is a window made of quartz, for example. Third resistive heater 3 has a gap 3h, as shown in FIG. 5. First measurement unit 9a captures radiant light from measurement position 5a4 through view port 15a, through hole 6a1 and gap 3h, to measure temperature Ta in measurement position 5a4. In this embodiment, a distance between measurement position 5a4 and first measurement unit 9a is preferably 300 mm or more and 1000 mm or less, and more preferably 500 mm or more and 800 mm or less.

Second measurement unit 9b is disposed to face bottom surface 5b1, and configured to be able to measure temperature Tb of bottom surface 5b1. Mount portion 4c is provided with a through hole 4h2. In a manner similar to first measurement unit 9a, second measurement unit 9b captures radiant light from a measurement position 5b4 through a view port 15b, a through hole 6b1, through hole 4h2 and a gap 1h (see FIG. 4), to measure temperature Tb in measurement position 5b4. In this embodiment, a distance between measurement position 5b4 and second measurement unit 9b is preferably 300 mm or more and 1000 mm or less, and more preferably 500 mm or more and 800 mm or less.

Figure 14:
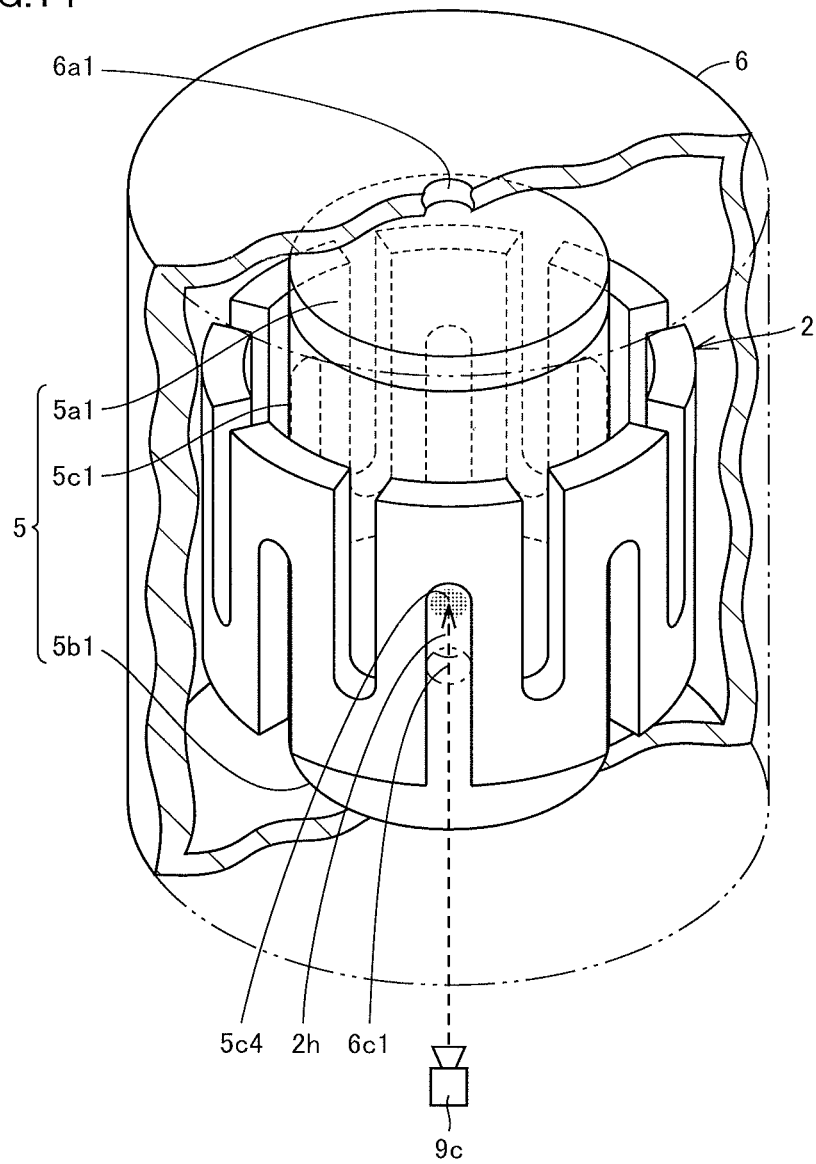
FIG. 14 is a schematic diagram illustrating a measurement position on a side surface of a crucible.

Third measurement unit 9c is disposed to face side surface 5c1, and configured to be able to measure temperature Tc of side surface 5c1. Second support portion 4b is provided with a through hole 4h1. On a straight line connecting a measurement position 5c4 on side surface 5c1 to third measurement unit 9c, a view port 15c, a through hole 6c1 and through hole 4h1 are provided. Second resistive heater 2 has a gap 2h, as shown in FIG. 14. As shown in FIG. 14, third measurement unit 9c captures radiant light from measurement position 5c4 through view port 15c (see FIG. 13), through hole 4h1 (see FIG. 13), through hole 6c1 (see FIG. 13) and gap 2h, to measure temperature Tc in measurement position 5c4. In this embodiment, a distance between measurement position 5c4 and third measurement unit 9c is preferably 300 mm or more and 1000 mm or less, and more preferably 500 mm or more and 800 mm or less.

As shown in FIG. 13, measurement position 5c4 is preferably located at a distance L of 20 mm or more and 100 mm or less from top surface 5a1 in direction D from top surface 5a1 toward bottom surface 5b1. This position substantially corresponds to space where sublimated source material 12 is transferred. By controlling the temperature of this position, therefore, a decrease in growth rate can be suppressed. Distance L is more preferably 30 mm or more and 90 mm or less, particularly preferably 40 mm or more and 80 mm or less, and most preferably 50 mm or more and 70 mm or less.

Here, second resistive heater 2 is preferably provided to be able to heat a position corresponding to measurement position 5c4. That is, second resistive heater 2 is preferably provided in a position overlapping with measurement position 5c4 of third measurement unit 9c in direction D from top surface 5a1 toward bottom surface 5b1, in order to accurately perform temperature control of side surface 5c1.

[Control Unit]

Temperature Ta of top surface 5a1 measured by first measurement unit 9a, temperature Tb of bottom surface 5b1 measured by second measurement unit 9b, and temperature Tc of side surface 5c1 measured by third measurement unit 9c are transmitted to control unit 20. Based on the measurement results from first measurement unit 9a, second measurement unit 9b and third measurement unit 9c, control unit 20 determines the amounts of electric power to be supplied to first resistive heater 1, second resistive heater 2 and third resistive heater 3 such that each of the measured temperatures attains a target temperature of each temperature determined so as to satisfy the conditions of 2100° C.≤Tc≤2400° C. and Ta<Tb<Tc, and provides a command to each of first power supply 8a, a second power supply 8b and a third power supply 8c. Accordingly, a silicon carbide single crystal can be grown while a decrease in growth rate is suppressed.

[Method of Manufacturing Silicon Carbide Single Crystal]

Figure 15:
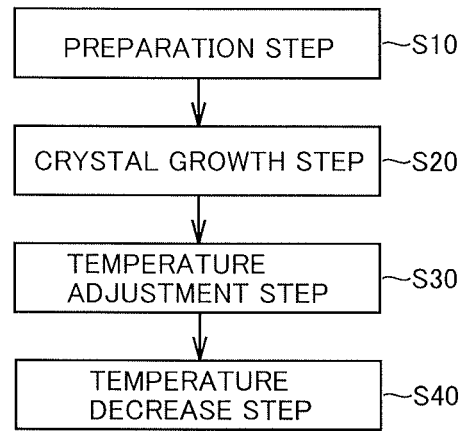
FIG. 15 is a flowchart showing an overview of a method of manufacturing a silicon carbide single crystal according to the embodiment.

According to another aspect of this embodiment, a method of manufacturing a silicon carbide single crystal is provided. FIG. 15 is a flowchart showing an overview of this manufacturing method. As shown in FIG. 15, this manufacturing method includes a preparation step (S10), a crystal growth step (S20), a temperature adjustment step (S30), and a temperature decrease step (S40). Each step will be described below.

[Preparation Step (S10)]

In the preparation step (S10), for example, manufacturing device 100 described above is prepared. That is, as shown in FIG. 13, manufacturing device 100 is prepared that mainly includes: crucible 5 having top surface 5a1, bottom surface 5b1 opposite to top surface Sat, and tubular side surface 5c1 located between top surface 5a1 and bottom surface 5b1; third resistive heater 3 disposed to face top surface 5a1; first resistive heater 1 disposed to face bottom surface 5b1; second resistive heater 2 provided to surround side surface 5c1; heat insulator 6; and support portion 4.

Then, source material 12 and seed crystal 11 are disposed in crucible 5. Source material 12 is powders of polycrystalline silicon carbide, for example. Source material 12 is disposed in accommodation portion 5b of crucible 5. Seed crystal 11 is a silicon carbide single crystal substrate having a polytype of 4H, for example. Backside surface 11a of seed crystal 11 is fixed on seed crystal holding surface 5a2 of pedestal 5a with an adhesive, for example. Seed crystal 11 has a diameter of 100 mm or more, for example, and preferably 150 mm or more. Growth surface 11b of seed crystal 11 is preferably a plane inclined at 1° or more and 8° or less relative to a (0001) plane or a (000-1) plane. As shown in FIG. 13, growth surface 11b of seed crystal 11 is disposed to face source material 12 in crucible 5.

[Crystal Growth Step (S20)]

Figure 16:
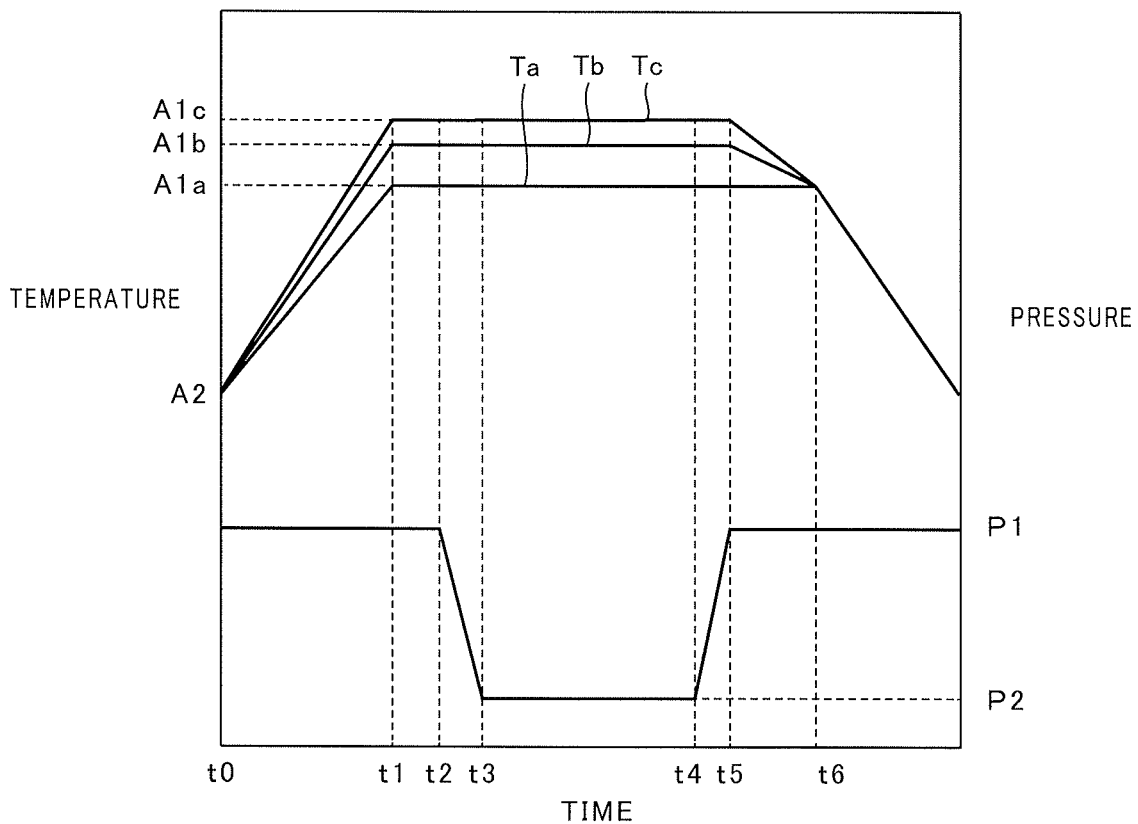
FIG. 16 is a timing chart showing an example of temperature control and pressure control in a crystal growth step.

In the crystal growth step (S20), a silicon carbide single crystal is grown on growth surface 11b by sublimating source material 12 in crucible 5. FIG. 16 is a timing chart showing an example of temperature control and pressure control in the crystal growth step (S20). This temperature control is performed by control unit 20 described above, for example.

As shown in FIG. 16, at time point to, each of temperature Ta of top surface 5a1, temperature Tb of bottom surface 5b1 and temperature Tc of side surface 5c1 is a temperature A2. Between time point t0 and time point t1, temperatures Ta, Tb and Tc are raised to target temperatures (a temperature A1a, a temperature A1b and a temperature A1c in FIG. 16), and maintained at the target temperatures between time point t1 and time point t5. Here, as shown in FIG. 13, in manufacturing device 100, temperature Tc of side surface 5c1 is measured in a portion located between source material 12 and seed crystal 11 in direction D from top surface 5a1 toward bottom surface 5b1. Although temperatures Ta, Tb and Tc reach the target temperatures simultaneously at time point t1 in FIG. 16, they do not need to reach the target temperatures simultaneously.

As shown in FIG. 16, in this embodiment, each resistive heater is controlled so as to satisfy Ta<Tb<Tc from the stage of temperature increase. By controlling temperature Tc to be the highest among temperatures Ta, Tb and Tc in this manner, a flow of sublimated source material 12 toward side surface 5c1 is suppressed, whereby a decrease in growth rate resulting from the flow is suppressed.

The target value of temperature Tc (temperature A1c in FIG. 16) is 2100° C. or more and 2400° C. or less. This is because a practical growth rate can be realized and a decrease in growth rate during the growth can be suppressed in this range. Temperature A1c may be 2150° C. or more and 2350° C. or less, or may be 2200° C. or more and 2300° C. or less.

From time point t0 to time point t1 when temperatures Ta, Tb and Tc reach the target temperatures, and through time point t2, a pressure in chamber 15 is maintained at a pressure P1. That is, a pressure in crucible 5 is maintained at pressure P1. Pressure P1 is atmospheric pressure, for example. Here, an atmosphere in chamber 15 is desirably an inert gas atmosphere such as argon gas, helium gas or nitrogen gas.

Between time point t2 and time point t3, the pressure in chamber 15 is lowered from pressure P1 to a pressure P2. Pressure P2 may be 0.5 kPa or more and 5 kPa or less. This is because the occurrence of discharge in chamber 15 can be suppressed while a decrease in growth rate is suppressed in this range. Pressure P2 is more preferably 0.5 kPa or more and 3 kPa or less, and particularly preferably 0.5 kPa or more and 2 kPa or less. The pressure in chamber 15 is subsequently maintained at pressure P2 until time point t4.

The sublimation of source material 12 and recrystallization of the source material on seed crystal 11 is started between time point t2 and time point t3. During the crystal growth, a temperature difference between temperature Tb of bottom surface 5b1 and temperature Ta of top surface 5a1 (Tb−Ta) is 10° C. or more and 200° C. or less, for example, and may be 10° C. or more and 150° C. or less, or may be 10° C. or more and 100° C. or less.

In addition, a temperature difference between temperature Tc of side surface 5c1 and temperature Tb of bottom surface 5b1 (Tc−Tb) during this time may be less than 100° C. Accordingly, an increase in surface temperature of the source material to a level higher than an internal temperature of the source material can be suppressed while a decrease in growth rate is suppressed. The temperature difference (Tc−Tb) may be 80° C. or less. The lower limit of the temperature difference (Tc−Tb) may be 5° C.

After the silicon carbide single crystal has been grown to a desired height, between time point t4 and time point t5, the pressure in chamber 15 is returned from pressure P2 to pressure P1. This leads to a pressure increase in crucible 5, whereby the sublimation of source material 12 is suppressed and eventually stopped. The crystal growth step (S20) is thus substantially completed.

[Temperature Adjustment Step (S30)]

After the crystal growth step (S20), an adjustment may be made such that temperature Ta of top surface 5a1, temperature Tb of bottom surface 5b1 and temperature Tc of side surface 5c1 attain substantially the same temperature. That is, between time point t5 and time point t6, each resistive heater may be controlled so as to satisfy Ta=Tb=Tc. This is because if the temperature difference among temperatures Ta, Tb and Tc is great during temperature decrease, thermal distortion may occur in the grown silicon carbide single crystal.

[Temperature Decrease Step (S40)]

From time point t6 when Ta=Tb=Tc is satisfied, the supply of electric power to each resistive heater is stopped to cool crucible 5. After the temperature of crucible 5 attains a temperature near room temperature, the silicon carbide single crystal is removed from crucible 5. In this manner, the silicon carbide single crystal can be manufactured while a decrease in growth rate is suppressed.

Next, a function and effect of the device of manufacturing a silicon carbide single crystal according to this embodiment will be described.

Device 100 of manufacturing a silicon carbide single crystal of this embodiment includes crucible 5, first resistive heater 1, second resistive heater 2, and first support portion 4a. Crucible 5 has top surface 5a1, bottom surface 5b1 opposite to top surface 5a1, and tubular side surface 5c1 located between top surface 5a1 and bottom surface 5b1. First resistive heater 1 is disposed to face bottom surface 5b1. Second resistive heater 2 is provided to surround side surface 5c1. First support portion 4a supports crucible 5 such that bottom surface 5b1 is separated from first resistive heater 1, and side surface 5c1 is separated from second resistive heater 2. First support portion 4a is in contact with at least one of top surface 5a1 and side surface 5c1. Accordingly, in-plane uniformity of the temperature of crucible 5 can be improved. As a result, the crystal quality of the silicon carbide single crystal can be improved.

Further, according to device 100 of manufacturing a silicon carbide single crystal of this embodiment, second resistive heater 2 has first surface 2a located on the side close to top surface 5a1, and second surface 2b located on the side close to bottom surface 5b1, in the direction from top surface 5a1 toward bottom surface 5b1. First support portion 4a is provided to be in contact with side surface 5c1 and to face first surface 2a. Accordingly, first support portion 4a is heated by second resistive heater 2, whereby escape of the heat of crucible 5 through first support portion 4a can be suppressed. Thus, the in-plane uniformity of the temperature of crucible 5 can be further improved.

Further, according to device 100 of manufacturing a silicon carbide single crystal of this embodiment, second surface 2b is located between bottom surface 5b1 and top surface 5a1 in the direction from top surface 5a1 toward bottom surface 5b1. Accordingly, degradation of the in-plane uniformity of the temperature of crucible 5 resulting from excessive heating of a portion in the vicinity of bottom surface 5b1 of crucible 5 by second resistive heater 2 can be suppressed.

Further, according to device 100 of manufacturing a silicon carbide single crystal of this embodiment, second resistive heater 2 has first surface 2a located on the side close to top surface 5a1, and second surface 2b located on the side close to bottom surface 5b1, in the direction from top surface 5a1 toward bottom surface 5b1. First support portion 4a is provided to be in contact with side surface 5c1 and to face second surface 2b. Accordingly, first support portion 4a is heated by second resistive heater 2, whereby escape of the heat of crucible 5 through first support portion 4a can be suppressed. Thus, the in-plane uniformity of the temperature of crucible 5 can be further improved.

Further, according to device 100 of manufacturing a silicon carbide single crystal of this embodiment, first support portion 4a is in contact with the entire circumference of side surface 5c1. Accordingly, the in-plane uniformity of the temperature of crucible 5 can be further improved.

Further, according to device 100 of manufacturing a silicon carbide single crystal of this embodiment, first support portion 4a is in contact with top surface 5a1. Accordingly, flexibility in arranging wires for supplying electric power to first resistive heater 1 and second resistive heater 2 can be increased.

Further, according to device 100 of manufacturing a silicon carbide single crystal of this embodiment, when viewed along the direction parallel to bottom surface 5b1, width W1 of first resistive heater 1 is greater than width W2 of internal space of crucible 5. Accordingly, the in-plane uniformity of the temperature of bottom surface 5b1 of crucible 5 can be further improved.

Further, device 100 of manufacturing a silicon carbide single crystal of this embodiment further includes third resistive heater 3 disposed to face top surface 5a1 and to be separated from top surface 5a1. Accordingly, the temperature of seed crystal 11 can be accurately controlled.

Further, according to device 100 of manufacturing a silicon carbide single crystal of this embodiment, the silicon carbide single crystal is configured such that it can be manufactured with a sublimation method. Accordingly, the uniformity of the crystal quality of the silicon carbide single crystal manufactured with a sublimation method can be improved.

Further, device 100 of manufacturing a silicon carbide single crystal according to this embodiment further includes third resistive heater 3 disposed to face top surface 5a1, and control unit 20 that controls first resistive heater 1, second resistive heater 2 and third resistive heater 3. Assuming that the temperature of top surface 5a1 is Ta, the temperature of bottom surface 5b1 is Tb, and the temperature of side surface 5c1 is Tc, control unit 20 is configured to control first resistive heater 1, second resistive heater 2 and third resistive heater 3 so as to satisfy 2100° C.≤Tc≤2400° C. and Ta<Tb<Tc.

A sublimation method is a crystal growth process of sublimating source material 12 disposed at the bottom within crucible 5 at a high temperature, and recrystallizing the sublimated source material (gas) on seed crystal 11 disposed at an upper portion within crucible 5. In the sublimation method, the temperature of bottom surface 5b1 of crucible 5 is controlled to be higher than the temperature of top surface 5a1. When the temperature of side surface 5c1 of crucible 5 becomes lower than the temperature of bottom surface 5b1, however, part of the sublimated source material may flow to side surface 5c1 having a low temperature instead of flowing to seed crystal 11, and adhere to side surface 5c1. In this case, an amount of the source material supplied to seed crystal 11 decreases, resulting in a decrease in growth rate of a single crystal.

For this reason, manufacturing device 100 described above includes second resistive heater 2 that heats side surface 5c1 of crucible 5, in addition to third resistive heater 3 that heats top surface 5a1 of crucible 5 and first resistive heater 1 that heats bottom surface 5b1 of crucible 5. Further, control unit 20 of manufacturing device 100 controls each resistive heater such that side surface 5c1 has the highest temperature among top surface 5a1, bottom surface 5b1 and side surface 5c1 of crucible 5. This allows the sublimated source material to be supplied to seed crystal 11, thus suppressing a decrease in growth rate resulting from the flow of the sublimated source material to side surface 5c1.

Further, device 100 of manufacturing a silicon carbide single crystal of this embodiment further includes first measurement unit 9a that measures the temperature of top surface 5a1, second measurement unit 9b that measures the temperature of bottom surface 5b1, and third measurement unit 9c that measures the temperature of side surface 5c1. The purpose of this is to reflect the measurement results of the temperatures of top surface 5a1, bottom surface 5b1 and side surface 5c1 in the temperature control.

Further, according to device 100 of manufacturing a silicon carbide single crystal of this embodiment, second resistive heater 2 is provided in a position overlapping with measurement position 5c4 on side surface 5c1 of third measurement unit 9c in the direction from top surface 5a1 toward bottom surface 5b1. The purpose of this is to accurately perform the temperature control of side surface 5c1.

Further, according to device 100 of manufacturing a silicon carbide single crystal of this embodiment, measurement position 5c4 on side surface 5c1 is located at distance L of 20 mm or more and 100 mm or less from top surface 5a1 in direction D from top surface 5a1 toward bottom surface 5b1. The purpose of this is to measure the temperature of side surface 5c1 in a position corresponding to space where the sublimated source material is transferred, and perform the temperature control of side surface 5c1 based on the measurement.

Further, device 100 of manufacturing a silicon carbide single crystal of this embodiment further includes heat insulator 6 provided on the outer side of second resistive heater 2 when viewed from crucible 5, heat insulator 6 having through hole 6c1 in a position corresponding to third measurement unit 9c. By disposing third measurement unit 9c on the outer side of heat insulator 6, third measurement unit 9c can be protected against high temperature by heat insulator 6.

Device 100 of manufacturing a silicon carbide single crystal according to the this embodiment is a device of manufacturing a silicon carbide single crystal with a sublimation method, which includes crucible 5, first resistive heater 1, second resistive heater 2, third resistive heater 3, and first support portion 4a. Crucible 5 has top surface 5a1, bottom surface 5b1 opposite to top surface 5a1, and tubular side surface 5c1 located between top surface 5a1 and bottom surface 5b1. First resistive heater 1 is disposed to face bottom surface 5b1. Second resistive heater 2 is provided to surround side surface 5c1. Third resistive heater 3 is disposed to face top surface 5a1. First support portion 4a supports crucible 5 such that bottom surface 5b1 is separated from first resistive heater 1, side surface 5c1 is separated from second resistive heater 2, and top surface 5a1 is separated from third resistive heater 3. Second resistive heater 2 has first surface 2a located on the side close to top surface 5a1, and second surface 2b located on the side close to bottom surface 5b1, in the direction from top surface 5a1 toward bottom surface 5b1. First surface 2a is disposed to face first support portion 4a. When viewed along the direction parallel to bottom surface 5b1, width W1 of first resistive heater 1 is greater than width W2 of internal space of crucible 5. First support portion 4a is in contact with the entire circumference of side surface 5c1. Second surface 2b of second resistive heater 2 is located between bottom surface 5b1 and top surface 5a1 in the direction from top surface 5a1 toward bottom surface 5b1. Accordingly, the in-plane uniformity of the temperature of crucible 5 can be further improved.

<Aspects>

The foregoing description includes features in the following aspects.

(Aspect 1)

A device of manufacturing a silicon carbide single crystal, comprising a crucible having a top surface, a bottom surface opposite to the top surface, and a tubular side surface located between the top surface and the bottom surface, a third resistive heater disposed to face the top surface, a first resistive heater disposed to face the bottom surface, a second resistive heater provided to surround the side surface, a control unit that controls the first resistive heater, the second resistive heater and the third resistive heater, a first measurement unit that measures a temperature of the top surface, a second measurement unit that measures a temperature of the bottom surface, a third measurement unit that measures a temperature of the side surface, and a heat insulator provided on an outer side of the second resistive heater when viewed from the crucible, the heat insulator having a through hole in a position corresponding to the third measurement unit, wherein the second resistive heater is provided in a position overlapping with a measurement position on the side surface of the third measurement unit in a direction from the top surface toward the bottom surface, the measurement position on the side surface is located at a distance of 20 mm or more and 100 mm or less from the top surface in the direction from the top surface toward the bottom surface, and assuming that the temperature of the top surface is Ta, the temperature of the bottom surface is Tb, and the temperature of the side surface is Tc, the control unit is configured to be able to control the first resistive heater, the second resistive heater and the third resistive heater so as to satisfy 2100° C.≤Tc≤2400° C. and Ta<Tb<Tc. According to this device of manufacturing a silicon carbide single crystal, a decrease in growth rate is suppressed.

(Aspect 2)

A method of manufacturing a silicon carbide single crystal, comprising the steps of preparing a crucible having a top surface, a bottom surface opposite to the top surface, and a tubular side surface located between the top surface and the bottom surface, a third resistive heater disposed to face the top surface, a first resistive heater disposed to face the bottom surface, a second resistive heater provided to surround the side surface, a source material provided in the crucible, and a seed crystal disposed to face the source material in the crucible, and growing a silicon carbide single crystal on the seed crystal by sublimating the source material, wherein in the growth step, a temperature of the side surface is measured between the source material and the seed crystal in a direction from the top surface toward the bottom surface, and assuming that a temperature of the top surface is Ta, a temperature of the bottom surface is Tb, and a temperature of the side surface is Tc, the first resistive heater, the second resistive heater and the third resistive heater are controlled so as to satisfy Ta<Tb<Tc.

In this manufacturing method, the temperature of the side surface of the crucible is measured between the source material and the seed crystal. This measurement position corresponds to space where the sublimated source material is transferred. In this manufacturing method, the temperature of the side surface is controlled to be the highest among the temperatures of the top surface, the bottom surface and the side surface of the crucible. This can suppress a flow of the sublimated source material toward the side surface, thereby suppressing a decrease in growth rate resulting from the flow of the sublimated source material toward the side surface.

(Aspect 3)

The method of manufacturing a silicon carbide single crystal according to aspect 2, wherein in the growth step, the temperature of the side surface is 2100° C. or more and 2400° C. or less.

(Aspect 4)

The method of manufacturing a silicon carbide single crystal according to aspect 2 or 3, wherein in the growth step, a temperature difference between the temperature of the side surface and the temperature of the bottom surface is less than 100° C.

(Aspect 5)

The method of manufacturing a silicon carbide single crystal according to any one of aspects 2 to 4, wherein in the growth step, a pressure in the crucible is controlled to be 0.5 kPa or more and 5 kPa or less.

(Aspect 6)

The method of manufacturing a silicon carbide single crystal according to any one of aspects 2 to 5, further comprising the steps of making an adjustment so as to satisfy Tc=Tb=Ta after the growth step, and decreasing the temperature of the top surface, the temperature of the bottom surface and the temperature of the side surface after the adjustment step. The purpose of this is to suppress the occurrence of thermal distortion in the grown silicon carbide single crystal.

(Aspect 7)

A method of manufacturing a silicon carbide single crystal, comprising the steps of preparing a crucible having a top surface, a bottom surface opposite to the top surface, and a tubular side surface located between the top surface and the bottom surface, a third resistive heater disposed to face the top surface, a first resistive heater disposed to face the bottom surface, a second resistive heater provided to surround the side surface, a source material provided in the crucible, and a seed crystal disposed to face the source material in the crucible, and growing a silicon carbide single crystal on the seed crystal by sublimating the source material, wherein in the growth step, a pressure in the crucible is controlled to be 0.5 kPa or more and 5 kPa or less, a temperature of the side surface is measured between the source material and the seed crystal in a direction from the top surface toward the bottom surface, and assuming that a temperature of the top surface is Ta, a temperature of the bottom surface is Tb, and a temperature of the side surface is Tc, the first resistive heater, the second resistive heater and the third resistive heater are controlled so as to satisfy 2100° C.≤Tc≤2400° C., Ta<Tb<Tc, and Tc−Tb<100° C. According to this manufacturing method, a decrease in growth rate can be suppressed.

It should be understood that the embodiments disclosed herein are illustrative and non-restrictive in every respect. The scope of the present invention is defined by the terms of the claims, and is intended to include any modifications within the scope and meaning equivalent to the terms of the claims.

What is claimed is:

1. A device of manufacturing a silicon carbide single crystal, comprising:
    a crucible having a top surface, a bottom surface opposite to said top surface, and a tubular side surface located between said top surface and said bottom surface;
    a first resistive heater disposed to face said bottom surface;
    a second resistive heater provided to surround said side surface, said second resistive heater is separate and distinct from said first resistive heater;
    a support portion that supports said crucible such that said bottom surface is separated from said first resistive heater, said side surface is separated from said second resistive heater, and said second resistive heater is disposed between said support portion and said side surface; and
    a heat insulator accommodating said crucible, the first resistive heater, and the second resistive heater,
    wherein said crucible has a pedestal being capable of holding a seed crystal and an accommodation portion being capable of accommodating a silicon carbide source material,
    wherein said support portion is in contact with the pedestal,
    wherein said support portion being disposed between the second resistive heater and the heat insulator, and
    wherein said support portion being disposed between said crucible and the heat insulator, said support portion being in contact with at least one of said top surface and said side surface, and said support portion being separated from said bottom surface.

2. The device of manufacturing a silicon carbide single crystal according to claim 1, wherein
    said second resistive heater has a first surface facing said top surface, and a second surface facing said bottom surface, in a direction from said top surface toward said bottom surface, and
    said support portion is disposed to be in contact with said side surface and to face said first surface.

3. The device of manufacturing a silicon carbide single crystal according to claim 2, wherein
    said second surface is located between said bottom surface and said top surface in said direction from said top surface toward said bottom surface.

4. The device of manufacturing a silicon carbide single crystal according to claim 1, wherein
    said second resistive heater has a first surface located on the side close to said top surface, and a second surface located on the side close to said bottom surface, in a direction from said top surface toward said bottom surface, and
    said support portion is provided to be in contact with said side surface and to face said second surface.

5. The device of manufacturing a silicon carbide single crystal according to claim 1, wherein
    said support portion is in contact with an entire circumference of said side surface.

6. The device of manufacturing a silicon carbide single crystal according to claim 1, wherein
    said support portion is in contact with said top surface.

7. The device of manufacturing a silicon carbide single crystal according to claim 1, wherein
    when viewed along a direction parallel to said bottom surface, a width of said first resistive heater is greater than a width of internal space of said crucible.

8. The device of manufacturing a silicon carbide single crystal according to claim 1, further comprising:
    a third resistive heater disposed to face said top surface and to be separated from said top surface, said third resistive heater is separate and distinct from said first resistive heater and said second resistive heater.

9. The device of manufacturing a silicon carbide single crystal according to claim 1, wherein
    said silicon carbide single crystal is configured such that it can be manufactured with a sublimation method.

10. The device of manufacturing a silicon carbide single crystal according to claim 1, further comprising:
    a third resistive heater disposed to face said top surface, said third resistive heater is separate and distinct from said first resistive heater and said second resistive heater; and
    a power supply connected to said first resistive heater, said second resistive heater and said third resistive heater, wherein
    assuming that a temperature of said top surface is Ta, a temperature of said bottom surface is Tb, and a temperature of said side surface is Tc, said power supply provides power to said first resistive heater, said second resistive heater and said third resistive heater so as to satisfy 2100° C. Tc 2400° C. and Ta<Tb<Tc.

11. The device of manufacturing a silicon carbide single crystal according to claim 10, further comprising:
    a first pyrometer that measures the temperature of said top surface;
    a second pyrometer that measures the temperature of said bottom surface; and
    a third pyrometer that measures the temperature of said side surface.

12. The device of manufacturing a silicon carbide single crystal according to claim 11, wherein said second resistive heater is provided in a position overlapping with a measurement position of said third pyrometer in said tubular side surface in a direction from said top surface toward said bottom surface.

13. The device of manufacturing a silicon carbide single crystal according to claim 12, wherein
said measurement position on said tubular side surface is located at a distance of 20 mm or more and 100 mm or less from said top surface in said direction from said top surface toward said bottom surface.

14. The device of manufacturing a silicon carbide single crystal according to claim 11, said heat insulator having a through hole in a position corresponding to said third pyrometer.

\* \* \* \* \*